United States Patent [19]

Kruit et al.

[11] Patent Number: 5,003,172

[45] Date of Patent: Mar. 26, 1991

[54] AUGER SPECTROMETRY

[75] Inventors: Pieter Kruit; Arno J. Bleeker, both of Delft, Netherlands; John A. Venables, Lewes, Great Britain

[73] Assignee: U.S. Philips Corporation, New York, N.Y.

[21] Appl. No.: 344,195

[22] Filed: Apr. 27, 1989

[30] Foreign Application Priority Data

May 4, 1988 [NL] Netherlands .......................... 8801163

[51] Int. Cl.[5] .......................................... H01J 37/145
[52] U.S. Cl. .................................... 250/305; 250/311; 250/396 R; 250/396 ML
[58] Field of Search ................. 250/305, 311, 396 ML, 250/396 R

[56] References Cited

U.S. PATENT DOCUMENTS

| | | |
|---|---|---|
| 3,937,957 | 2/1976 | Schillalies et al. ................... 250/305 |
| 4,205,226 | 5/1980 | Gerlach ............................... 250/305 |
| 4,570,072 | 2/1986 | Kimura et al. .............. 250/396 ML |
| 4,585,942 | 4/1986 | Tsuno .......................... 250/396 ML |
| 4,633,085 | 12/1986 | Tomita et al. ................ 250/396 ML |
| 4,714,833 | 12/1987 | Rose et al. ........................... 250/397 |
| 4,810,879 | 3/1989 | Walker ................................. 250/305 |
| 4,812,652 | 3/1989 | Egle et al. ................... 250/396 ML |
| 4,818,872 | 4/1989 | Parker et al. .................... 250/396 R |

Primary Examiner—Jack I. Berman
Assistant Examiner—Kiet T. Nguyen
Attorney, Agent, or Firm—Paul R. Miller

[57] ABSTRACT

An objective lens in an electron microscope is adapted to detection of Auger electrons. Using an additional lens field, preferably including the use of a VAIL lens, the electrons to be detected are spiraled to a selection space. Between the lens field and the selection space a preferably displaceable, magnetic diaphragm is arranged for the separation of lens fields.

20 Claims, 1 Drawing Sheet

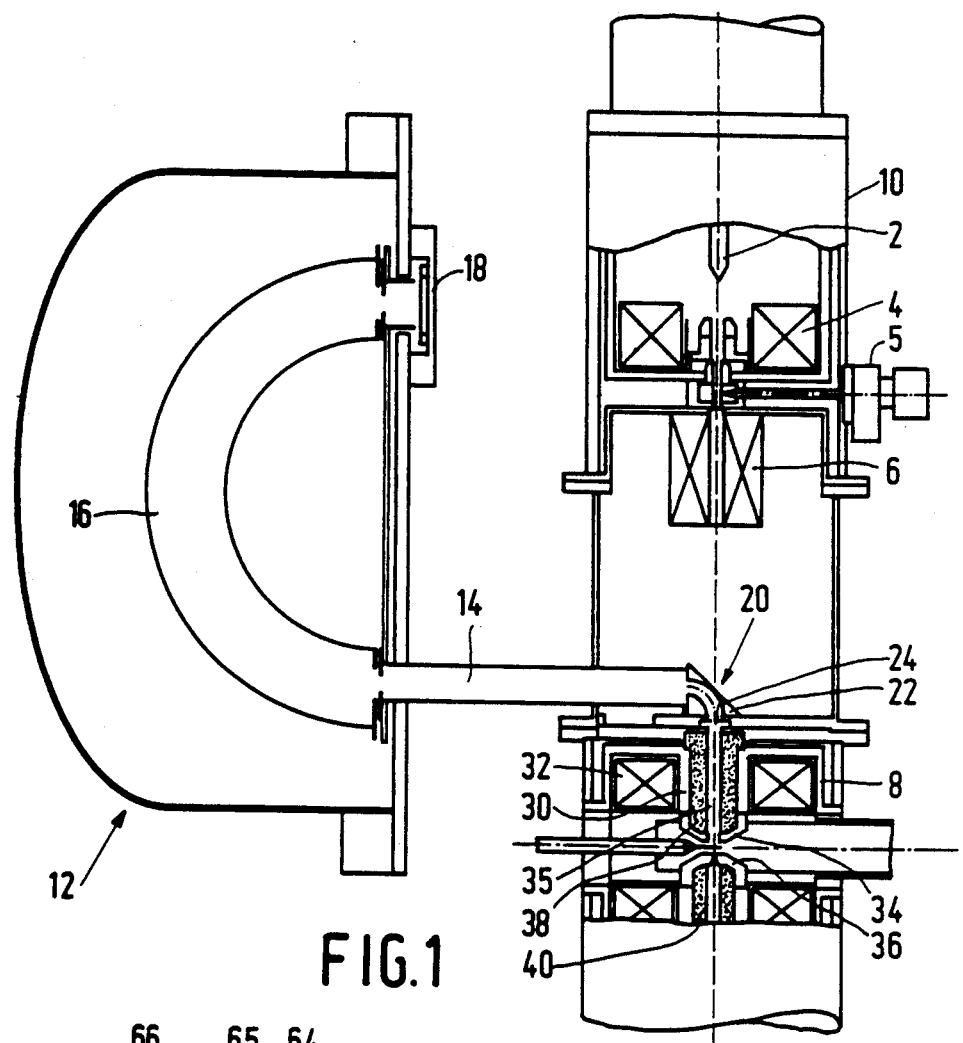
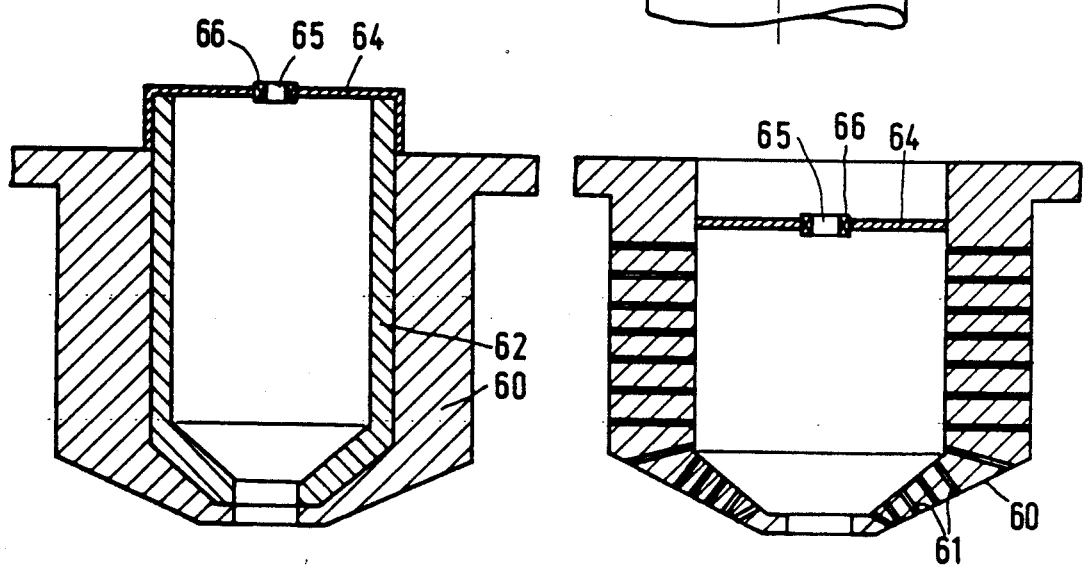

AUGER SPECTROMETRY

The invention relates to an apparatus for examining an object by detection of comparatively low energetic electrons emanating therefrom.

BACKGROUND OF THE INVENTION

An apparatus of this kind is described in Journal Phys. E. Sci. Instruments, Vol. 16, 1983, pp. 313-324. In apparatus of this kind electrons to be detected are preferably generated in a space in which a comparatively strong magnetic field prevails, which electrons are conducted further to a selection space. The electrons then spiral along paths parallel to the optical axis. In the selection space the electrons are directed towards a detector, for example by means of measuring fields to be applied therein. Discrimination as regards kinetic energy of the electrons can be performed, for example by measuring their delay time, by measuring their transmission through a suppression grid, or by measuring their deflection by means of a crossed magnetic-electrostatic field. It would be attractive to perform these measurements in an electron microscope; however, that would have the drawbacks that these measurements are not suitable, for example for Auger electron energies, that the energy resolution is limited, and that the required space with the fields to be generated therein exert a disturbing influence on an irradiating primary electron beam in the microscope.

In general it may be stated that, for example a transmission electron microscope must be capable of focussing the electron beam on a specimen surface to a minimum diameter which is limited only by the optical properties of an objective lens and by the electron wavelength, that the beam position must be stable, and that the beam must be displacable across the specimen surface by means of a beam deflection device. For an Auger electron spectrometer a high electron transmission and a high energy resolution are required and the electron energy to be detected must be adjustable without affecting the position of the irradiating primary electron beam.

SUMMARY OF THE INVENTION

It is the object of the invention to provide an apparatus in which these requirements are satisfied but the drawbacks are mitigated. To achieve this, an apparatus of the kind set forth in accordance with the invention is characterized in that a device for the detection of comparatively low-energetic electrons comprises a magnetic diaphragm in order to separate a lens field for electron extraction from an object to be examined and a space for applying dispersive fields for the electrons to be detected.

In a preferred embodiment, near a pole-piece of the objective lens there is arranged a coil for generating a magnetic field which extends in the same direction as a magnetic field to be generated between the pole-pieces and whose strength varies so that the two fields smoothly continue one into the other. Thus, the objective lens need not be modified.

In another preferred embodiment, the magnetic permeability of a pole-piece material of the objective lens is varied in a location-dependent manner, so that a combined objective lens field and detection field having the desired properties can be generated. Thus, it is not necessary to reserve space for an additional coil so that the separate adjustment thereof can also be dispensed with.

In a further preferred embodiment, a combined electrostatic magnetic field is generated in a field-free space which is formed by the magnetic shielding, where the combined electrostatic-magnetic field deflects the electrons to be detected away from the optical axis, but neither causes displacement across the object or necessitates additional focussing.

These fields can be generated by a combined deflection device which is adjusted to a fixed value and which comprises means for detecting different accelerations of the electrons. Such an accelerator field is rotationally-symmetrical, so that it does not cause displacement of the primary beam. The deflection fields can be generated by a controllable deflection device with back projection of the specimen surface being realized so as to coincide with a beding point in the primary beam. Local deflection of the primary beam in that case does not influence the location of the spot on the specimen. The electrostatic deflection field for the primary beam can also be compensated for by means of an adapted magnetic field. For the electrons to be detected, however, an effective deflection field remains which can be varied for different energies thereof. Compensation of deflection fields for the primary beam can also be realized elsewhere (for example, precompensation); at those areas this field does not have a negative effect on the paths of the electrons to be detected.

In a further additional preferred embodiment, such deflection fields are generated that no dispersion occurs for secondary electrons having an energy approximately equal to $E_1$, but that for electrons having an energy $E_2$ a deviation proportional to $(E_2-E_1)^2$ occurs with respect to electrons having an energy $E_1$.

Secondary electrons within a given energy range can then be deflected in a desired direction without further field variation. The advantage thereof consists in that the method is insusceptible to any beam alignment of the primary beam with means being included for monochromatizing the primary electron beam.

In a preferred embodiment, the specimen is arranged in a lens system whereby beam scanning can be realized with displacement of the optical axis. The invention offers the advantage that the strength of the objective lens remains controllable during the measuring process because the occurrence of saturation phenomena therein is avoided.

For the irradiating primary beam use can also be made of an ion beam or a photon beam instead of an electron beam. When a photon beam is used, an area where from detection takes place can be selected by means of diaphragms which succeed one another in the direction of the primary beam. A part of the surface of the specimen to be examined can again be displaced across the specimen by means of a VAIL lens such as discussed in the article by Pfeiffer et al in Electron Optical Systems, pages 109-114 (1984).

BRIEF DESCRIPTION OF THE DRAWINGS

FIG. 1 shows an apparatus in accordance with the invention in the form of an electron microscope, and FIGS. 2 and 3 show embodiments of suitable lenses.

DESCRIPTION OF THE INVENTION

An apparatus as shown in FIG. 1 comprises an electron exposure apparatus which is constructed as an electron microscope, comprising an electron source 2, a condensor lens 4, a projection lens 6 and an objective lens 8. All components are accommodated in a housing 10 which can be evacuated to, for example $10^{-9}$ torr. Laterally on the housing there is mounted an electro-analysis device 12, comprising an entrance optical system 14, a 180° deflection device 16, and an electron registration system 18 which includes, for example a television pick-up tube or an electron counting device. Because irradiation takes place by means of an electron beam and the object is oriented in the lens field space of the objective lens, it is necessary to return the beam to be detected through the lens field and to direct it toward the detection device only in a selection space 20; therefore, the beam must be deflected substantially away from the beam path of the primary beam. To achieve this, the lens field between the lens and the detection space should decrease comparatively quickly, for which purpose there is provided a ferromagnetic shield 22. The irradiating electron beam and the electrons to be detected can pass through small aperture 24 therein. A yoke 30, a main coil 32 with pole-pieces 34 and 36 with an aperture 35 for the irradiating beam and the beam to be measured, respectively, and a parallelizing coil 38, accommodated in the pole-piece 34, and a parallelizing coil 40, for example accommodated in the pole-piece 36, of such a device are shown.

The field of the parallelizing coil 38 is limited by the magnetic diaphragm 22. The parallelizing coils may include stigmators, a pot-specimen lens alignment and the scan coils. In the selection space 20 there is arranged an electron mirror and there may also be provided an energy analyser for the detection of low-energetic electrons. For the detection of high-energetic secondary emission electrons there may be provided a secondary electron detector.

A lens as shown in FIG. 2 comprises an iron yoke 60, corresponding to the yoke 30 of the objective lens, a parallelizing coil 62 and a magnetic diaphragm plate 64 with an aperture 65. The magnetic diaphragm plate 64 can also be arranged to be displaceable so that the aperture is mechanically adjustable in a radial direction.

A lens as shown in FIG. 3 comprises an iron yoke 60 in which there are provided slits 61 which are filled with non-magnetic material, or not, and which provide a variable permeability. The non-magnetic material need not be provided in the form of filled slits but may also be distributed otherwise. This lens again comprises a magnetic diaphragm 64 with a possibly displaceable aperture 65. In or near the aperture 65 there may be provided auxiliary coils 66 for applying a lens field for shifting the axis at that area.

We claim:
1. An electron-optical apparatus for examining an object comprising
   (a) first means for generating a primary beam of electrons along an optical axis,
   (b) second means for directing flow of said primary beam along said optical axis,
   (c) an object receiving said primary beam and emitting both low-energy electrons and high energy electrons,
   (d) third means for detecting said low-energy electrons, said third means including magnetic diaphragm means for separating a lens field of an objective lens between said object and a detection space, said lens field extracting electrons from said object, and
   (e) fourth means for applying dispersive fields in said detection space to said low-energy electrons to be detected.

2. An electron-optical apparatus according to claim 1, wherein said second means includes an electromagnetic objective lens having pole-pieces generating a first magnetic field between said pole-pieces, and coil means for generating a second magnetic field extending in the same direction as said first magnetic field, said coil means being disposed along said optical axis at a slight distance from one of said pole-pieces, and said second magnetic field having a varying field strength such that said first and second magnetic fields smoothly continue one into the other.

3. An electron-optical apparatus according to claim 2, wherein said pole-pieces have non-magnetic material locally disposed therein, said pole-pieces with said non-magnetic material having a location-dependent permeability for generating a low field to direct electrons.

4. An electron-optical apparatus according to claim 3, wherein said fourth means includes fifth means for forming a field area including both electrostatic and magnetic fields, said fifth means deflecting said low-energy electrons from said optical axis in a selection space of said field area, said field area influencing said primary beam of electrons in a compensated manner.

5. An electron-optical apparatus according to claim 4, wherein said fifth means includes means for varying an accelerator field in said selection space and means for generating a constant deflection field in said selection space for said low-energy electrons.

6. An electron-optical apparatus according to claim 5, wherein said fifth means includes means for generating a variable deflection field in said selection space at a location where said primary beam is only varied by an angle of incidence.

7. An electron-optical apparatus according to claim 4, wherein said fifth means compensates any electrostatic effect on said primary beam from said field area with said magnetic field portion.

8. An electron-optical apparatus according to claim 4, wherein said second means includes beam deflection means for precompensating deflections of said primary beam in said selection space.

9. An electron-optical apparatus according to claim 8, wherein said beam deflection means also provide monochromatizing fields for said primary beam.

10. An electron-optical apparatus according to claim 4, wherein said fifth means generates a non-dispersive deflection field for electrons having an adjustable energy E, and said fifth means imparting a deflection proportional to the square of an energy difference for electrons having energies deviating from said adjustable energy E.

11. An electron-optical apparatus according to claim 4, wherein means for imaging relevant parts of a surface of said object are disposed in or near said selection space.

12. An electron-optical apparatus according to claim 1, wherein secondary electron detector means are disposed at opposite sides of said object for detecting said high-energy secondary electrons.

13. An electron-optical apparatus according to claim 1, wherein said second means includes VAIL lens means for scanning said object by said primary beam and deflection coil means disposed near said magnetic diaphragm means for displacing said magnetic diaphragm means with axis displacement.

14. An electron-optical apparatus according to claim 1, wherein said second means includes an objective lens, said objective lens being an iron free superconducting coil.

15. An electron-optical apparatus according to claim 1, wherein said second means includes a single pole-piece lens for scanning Auger detection.

16. An electron-optical apparatus for examining an object comprising
  (a) first means for generating a primary beam of photons, ions or atoms,
  (b) second means for directing flow of said primary beam along said optical axis,
  (c) an object receiving said primary beam and emitting low-energy electrons,
  (d) third means for detecting said low-energy electrons, said third means including magnetic diaphragm means for separating a lens field of an objective lens between said object and a detection space, said lens field extracting electrons from said detection space, and
  (e) fourth means for applying dispersive fields in said detection space to said low-energy electrons to be detected.

17. An apparatus according to claim 16, wherein said primary beam is aimed at said object at an angle $\alpha$, where $0 < \alpha \leq 90°$.

18. An apparatus according to claim 17, wherein said magnetic diaphragm means determines a magnitude of a surface of said object in order to detect electrons.

19. An apparatus according to claim 17, wherein said magnetic diaphragm means includes at least one additional diaphragm in a direction of a beam of low-energy electrons from said object in order at least to limit a surface of said object and to limit an angle of aperture for said low-energy electrons.

20. An electron-optical apparatus according to claim 17, wherein said fourth means includes fifth means for forming a field area including both electrostatic and magnetic fields, said fifth means deflecting said low-energy electrons from said optical axis in a selection space of said field area, said field area influencing said primary beam in a compensated manner.

* * * * *